(12) United States Patent
Cheng et al.

(10) Patent No.: US 9,419,078 B2
(45) Date of Patent: Aug. 16, 2016

(54) FLOATING BODY MEMORY WITH ASYMMETRIC CHANNEL

(71) Applicant: International Business Machines Corporation, Armonk, NY (US)

(72) Inventors: Kangguo Cheng, Schenectady, NY (US); Bruce B. Doris, Slingerlands, NY (US); Ali Khakifirooz, Los Altos, CA (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/520,434

(22) Filed: Oct. 22, 2014

(65) Prior Publication Data

US 2016/0118463 A1   Apr. 28, 2016

(51) Int. Cl.
*H01L 29/10* (2006.01)
*H01L 29/165* (2006.01)
*H01L 29/78* (2006.01)
*H01L 29/66* (2006.01)
*H01L 27/108* (2006.01)
*H01L 21/266* (2006.01)
*H01L 21/265* (2006.01)
*H01L 21/02* (2006.01)
*H01L 21/306* (2006.01)

(52) U.S. Cl.
CPC ...... *H01L 29/1054* (2013.01); *H01L 21/02532* (2013.01); *H01L 21/266* (2013.01); *H01L 21/26513* (2013.01); *H01L 21/26586* (2013.01); *H01L 21/30604* (2013.01); *H01L 27/10802* (2013.01); *H01L 29/165* (2013.01); *H01L 29/66659* (2013.01); *H01L 29/66803* (2013.01); *H01L 29/7851* (2013.01)

(58) Field of Classification Search
CPC ............ H01L 29/1054; H01L 21/266; H01L 29/7851; H01L 21/26586; H01L 21/26513; H01L 29/66659; H01L 21/02532; H01L 29/66803; H01L 27/10802; H01L 29/165; H01L 21/30604
USPC .................................................. 257/190, 241
See application file for complete search history.

(56) References Cited

U.S. PATENT DOCUMENTS

| | | | |
|---|---|---|---|
| 6,744,083 B2 | 6/2004 | Chen et al. | |
| 7,612,420 B2 | 11/2009 | Lenoble | |
| 7,910,413 B2 | 3/2011 | Zhu | |
| 7,944,003 B2 | 5/2011 | Ban et al. | |
| 8,237,197 B2 | 8/2012 | Chen et al. | |
| 8,263,446 B2 | 9/2012 | Cheng et al. | |
| 2007/0278572 A1 | 12/2007 | Ban et al. | |
| 2008/0105897 A1* | 5/2008 | Zhu | H01L 29/78687 257/190 |

* cited by examiner

*Primary Examiner* — Caleen Sullivan
(74) *Attorney, Agent, or Firm* — Isaac J. Gooshaw (57) ABSTRACT

A semiconductor structure and formation thereof. The semiconductor structure has a fin of a first semiconductor material. The fin has a first side surface opposite a second side surface. The semiconductor structure has a portion of a second semiconductor material that has a third side surface opposite a fourth side surface. The fourth side surface of the second semiconductor material abuts and covers the first side surface of the fin. The semiconductor structure has a portion of a third semiconductor material that abuts and covers the second side surface of the fin. The semiconductor structure has a single gate structure that covers the fin, the portion of the second semiconductor material and the portion of the third semiconductor material. The fin manifests an asymmetry due to the portion of the second semiconductor material and the portion of the third semiconductor material.

7 Claims, 7 Drawing Sheets

FLOATING BODY MEMORY WITH ASYMMETRIC CHANNEL

BACKGROUND OF THE INVENTION

The present invention relates generally to the field of semiconductor devices, and more particularly to formation of transistor channels that are attached to source/drain semiconductor structures.

The transistor is a solid state semiconductor device which can be used for amplification, switching, voltage stabilization, signal modulation and many other functions. Generally, a transistor has three terminals, and a voltage applied to a specific one of the terminals controls current flowing between the other two terminals.

The terminals of a field effect transistor (FET) are commonly named source, gate and drain. In the FET, a small amount of voltage is applied to the gate in order to control current flowing between the source and drain. In FETs, the main current appears in a narrow conducting channel formed near (usually primarily under) the gate. This channel connects electrons from the source terminal to the drain terminal. The channel conductivity can be altered by varying the voltage applied to the gate terminal, enlarging or constricting the channel and thereby controlling the current flowing between the source and the drain.

SUMMARY

According to one embodiment of the present disclosure, a semiconductor structure is provided. The semiconductor structure includes a fin made of a first semiconductor material. The fin has a first side surface opposite a second side surface. The semiconductor structure includes a portion of a second semiconductor material that is attached to the fin. The portion of the second semiconductor material has a third side surface opposite a fourth side surface. The fourth side surface of the second semiconductor material abuts and covers, at least in part, the first side surface of the fin. The semiconductor structure includes a portion of a third semiconductor material abuts and covers, at least in part, the second side surface of the fin. The semiconductor structure includes a single gate structure that covers, at least in part, the fin, the portion of the second semiconductor material and the portion of the third semiconductor material. The fin manifests an asymmetry due to the portion of the second semiconductor material and the portion of the third semiconductor material abutting the side surfaces of the fin.

According to one embodiment of the present disclosure, a method of forming a semiconductor structure is provided. The method includes: forming a fin on a substrate. The fin has a first side surface opposite a second side surface, and also a top surface. A portion of first semiconductor material is formed, which has a third side surface opposite a fourth side surface. The fourth side surface abuts the first side of the fin. The portion of first semiconductor material biases the first side surface of the fin channel during at least one of inversion and accumulation. A portion of second semiconductor material that abuts the second side of the fin is formed. The portion of second semiconductor material biases the second side surface of the fin channel during at least one of inversion and accumulation. A single continuous gate electrode is formed that covers at least a portion of each of the fin, the portion of first semiconductor material, and the portion of second semiconductor material.

BRIEF DESCRIPTION OF THE SEVERAL VIEWS OF THE DRAWINGS

The following detailed description, given by way of example and not intend to limit the disclosure solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

A Field Effect Transistor (FET) is a type of transistor that is well known in the Very Large Scale Integration (VLSI) electronic arts. Standard components of an FET are the source, the drain, the body in-between the source and the drain, and the gate. The gate overlays the body and can induce a conducting channel on the surface of the body between the source and the drain. In the usual nomenclature, the FET is hosted on the surface of the body. The gate is typically separated from the body surface by the gate insulator, or gate dielectric. Depending whether the "on state" current in the channel is carried by electrons or by holes, the FET comes in two types: as NFET, or PFET. In different nomenclature, the NFET and PFET devices are often referred to as NMOS and PMOS devices.

There is a family of FET devices that have a non-planar, three-dimensional geometric configuration. Such devices are considered three-dimensional because they are associated with fin structures. In fin-type devices, the body of the transistor is formed in a fin rising out of a planar background, typically having both vertical and horizontal surfaces. The gate of the non-planar device may engage the vertically oriented body surfaces, or sidewalls, and the top surface as well, resulting in several planes being used for transistor channel formation. In other typical non-planar devices, the gate of the non-planar device does not engage the top surface but still engages the vertically-oriented body surfaces. There are further variations of non-planar devices, for instance, some with multi-faceted fins and multiple sidewall sections. In the nomenclature of the art, non-planar fin-type devices where only the sidewall surfaces are engaged by the gate are called FinFET devices. Embodiments of the present invention deal with such FinFET devices (also referred to herein as FET devices).

A typical FinFET, as fabricated and used presently in the art, has a symmetric structure, meaning that the FinFET devices (including structures and compositions therein) on each side surface of the fin are essentially identical with one other, having the same device characteristics. However, for some applications, it is desirable to have an asymmetric single-gated FinFET. For instance, depending on the power supply, the characteristics of the asymmetric FinFET can be adjusted to achieve an optimal trade-off between power consumption and device performance. For example, when the FinFET is powered by a battery, low power consumption requirements usually outweigh performance requirements. On the other hand, when the FinFET is powered by an external AC supply, high performance is usually desired.

Multiple-gate transistors are one of several strategies being developed by CMOS semiconductor manufacturers to create ever-smaller microprocessors and memory cells. One known challenge to widespread implementation of multiple-gate transistors is manufacturability, as both planar and non-planar designs present significant challenges, especially with respect to lithography and patterning.

Dynamic random-access memory (DRAM) is a type of random-access memory that stores each bit of data in a separate capacitor within an integrated circuit. The capacitor can be either charged or discharged; these two states are taken to represent the two values of a bit, conventionally called 0 and 1. Since even "non-conducting" transistors typically leak a small amount, the capacitors will slowly discharge, and the information eventually fades unless the capacitor charge is refreshed periodically. This refresh requirement differentiates dynamic memory from static memory (e.g., static random-access memory or SRAM).

Planar double-gate transistors employ conventional planar (layer-by-layer) manufacturing processes to create double-gate devices, avoiding, in part, more stringent lithography requirements associated with non-planar, vertical transistor structures. In planar double-gate transistors, the channel is sandwiched between two independently-fabricated gate/gate oxide stacks. One challenge in fabricating such structures is achieving satisfactory self-alignment between the upper and lower gates.

The term FinFET was coined by University of California, Berkeley researchers to describe a non-planar, double-gate transistor built on an SOI substrate, based on the earlier DELTA (single-gate) transistor design. The distinguishing characteristic of the FinFET is that the conducting channel (gate) is wrapped around a thin silicon "fin", which forms the body of the device. The dimensions of the fin determine the effective channel length of the device. In technical literature, FinFET is used somewhat generically to describe any fin-based, multiple-gate transistor architecture regardless of number of gates. Generally, a silicon "fin", which forms the body of the device, and comprises an elongate (long and narrow) polysilicon structure disposed on the surface of a substrate. The two ends of the fin may be enlarged, one end serving as the "source", the other end serving as the "drain" of the device. A channel is defined by an area between the source and drain.

Static random-access memory (SRAM or static RAM) is a type of semiconductor memory that uses bistable latching circuitry to store each bit. The term static differentiates it from DRAM which must be periodically refreshed. SRAM exhibits data remanence (the residual representation of digital data that remains even after attempts have been made to remove or erase the data), but it is still volatile in the conventional sense that data is eventually lost when the memory is not powered.

One advantage of DRAM is its structural simplicity; that is, only one transistor and a capacitor are required per bit, compared to four or six transistors in SRAM. This allows DRAM to reach very high densities. Unlike flash memory (non-volatile computer storage medium that can be electrically erased and reprogrammed), DRAM is volatile memory, since it loses its data quickly when power is removed. The transistors and capacitors used for DRAM are often extremely small. For example, billions of such transistors and capacitors can fit on a single memory chip.

The floating body effect is the effect of dependence of the body potential of a transistor realized by the silicon on insulator (SOI) technology on the history of its biasing and the carrier recombination processes. The transistor's body forms a capacitor against the insulated substrate. The charge accumulates on this capacitor and may cause adverse effects, for example, opening of parasitic transistors in the structure and causing off-state leakages, resulting in higher current consumption and, in case of DRAM, in loss of information from the memory cells. It also causes the history effect, which refers to the dependence of the threshold voltage of the transistor on its previous states. In analog devices, the floating body effect is known as the "kink effect".

FinFET floating body memory utilizes gates that are configured such that one side of the fin is biased in inversion, while the other side is biased in accumulation. This complicates device processing and makes it incompatible with logic FinFET fabrication (DRAM fins utilize a split gate process, while logic fins utilize a gate that wraps around). Furthermore, the need to provide individual contacts to the two gates makes it impossible to use a continuous gate structure that is shared by multiple cells, such as, for example, in a word-line.

Embodiments of the present invention provide an asymmetric channel for a field-effect transistor (FET) device and other like devices. One embodiment provides a FinFET that includes such an asymmetric channel. One embodiment provides a FinFET floating body memory with such an asymmetric channel. Embodiments provide a single gate structure that biases one side during accumulation and another side during inversion.

Exemplary embodiments now will be described more fully herein with reference to the accompanying drawings, in which exemplary embodiments are shown. In the following detailed description, numerous specific details are set forth in order to provide a thorough understanding of various embodiments of the invention. However, it is to be understood that embodiments of the invention may be practiced without these specific details. As such, this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

As described below in conjunction with FIGS. 1-7, embodiments may include methods of forming a semiconductor device with a single gate that biases one side of the fin during accumulation of a write process and another side of the fin during inversion of the write process. The method described below in conjunction with FIGS. 1-7 may be incorporated into typical semiconductor fabrication processes, such as fin field effect transistor (FinFET) fabrication processes.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is focused on the distinctive features or elements of various embodiments of the present invention.

As used herein, semiconductor structures refer to one or more physical structures that comprise semiconductor devices.

The present invention will now be described in detail with reference to the Figures.

Figure 1A:
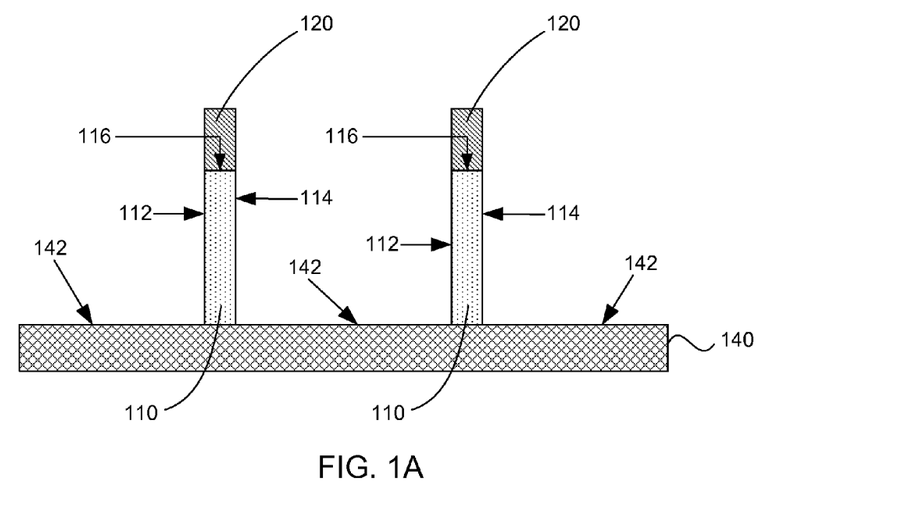
FIG. 1A illustrates a cross-sectional view depicting a semiconductor structure that includes fins (i.e., vertical channels) covered by a portion of hard-mask, in accordance with an exemplary embodiment of the present invention.

Referring now to FIG. 1A, FIG. 1A illustrates a cross-sectional view depicting a semiconductor structure that includes fins 110 (areas that can form vertical channels) covered by a portion of hard-mask 120, in accordance with an exemplary embodiment of the present invention. FIG. 1A further depicts a substrate 140. In this embodiment, fins 110 are composed of silicon. In this embodiment, portions of hard-mask 120 are composed of silicon nitride. In other embodiments, portions of hard-mask 120 are comprised of any material or combinations of materials that will act as a protecting layer during the formation of the semiconductor structures of FIGS. 1A-3A.

FIG. 1A also illustrates SOI substrate 140. In some embodiments, fins 110 are formed on an SOI substrate 140, which includes a buried oxide layer (BOX), and a substrate layer. In other embodiments, fins 110 may be formed on a bulk semiconductor substrate. In general, SOI substrate 140 includes one or more layers of material(s) upon which the structures of FIGS. 1-7 can be formed, in accordance with a desired embodiment of the present invention. As shown in FIG. 1A, each fin 110 includes two side surfaces (112 and 114) and a top surface 116, and substrate SOI 140 includes a top surface 142. As shown, portions of hard-mask 120 are on top of fins 110, i.e., top surface 116 of fins 110 abut portions of hard-mask 120. Note that, for clarity of FIGS. 1B-7, the reference numbers for side surfaces 112 and 114, and top surface 116 are omitted, although the structures still exist.

As used herein, terms such as "depositing", "forming", and the like refer to the disposition of layers or portions of materials in the present embodiments. Such processes may or may not be different than those used in the standard practice of the art of FET fabrication. Such processes include but are not limited to, atomic layer deposition (ALD), molecular layer deposition (MLD), chemical vapor deposition (CVD), low-pressure chemical vapor deposition (LPCVD), plasma enhanced chemical vapor deposition (PECVD), limited reaction processing CVD (LRPCVD), ultrahigh vacuum chemical vapor deposition (UHVCVD), metalorganic chemical vapor deposition (MOCVD), physical vapor deposition, sputtering, plating, evaporation, ion beam deposition, electron beam deposition, laser assisted deposition, chemical solution deposition, or any combination of those methods.

Figure 1B:
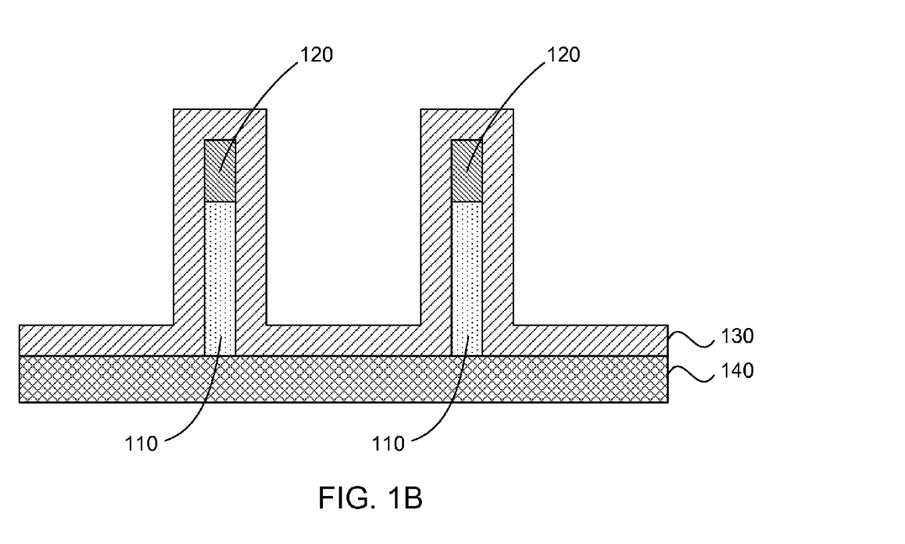
FIG. 1B illustrates a cross-sectional view depicting the formation of a layer of liner material on the semiconductor structure of FIG. 1A, in accordance with an exemplary embodiment of the present invention.

FIG. 1B illustrates a cross-sectional view depicting the formation of a layer of liner material on the semiconductor structure of FIG. 1A, in accordance with an exemplary embodiment of the present invention. As shown, side surfaces (112 and 114) of fins 110 and portions of hard-mask 120 are covered by a layer of liner material 130, in accordance with an exemplary embodiment of the present invention. In this embodiment, liner material 130 is composed of silicon nitride. In other embodiments, the composition of liner material 130 varies. In general, liner material 130 is composed of any material that can be selectively altered such that the altered portions and the unaltered portions have different characteristics and resulting propensities for removal. A more detailed example and explanation of such a process is provided in the discussion of FIG. 2.

Figure 2:
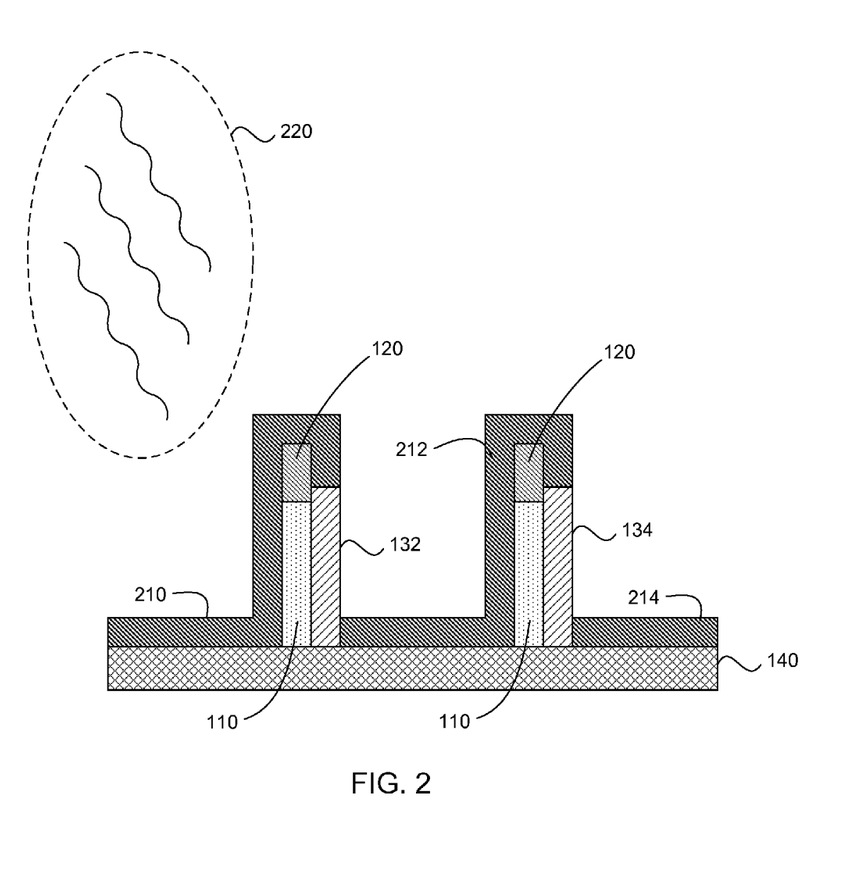
FIG. 2 illustrates a cross-sectional view depicting a semiconductor structure that results from exposing the semiconductor structure of FIG. 1 to angled ion implantation, in accordance with an exemplary embodiment of the present invention.

FIG. 2 illustrates a cross-sectional view depicting a semiconductor structure that results from exposing the semiconductor structure of FIG. 1 to angled ion implantation (220, e.g., xenon ion implantation), also called tilted ion bombardment, in accordance with an exemplary embodiment of the present invention. In a typical embodiment of the invention, the ion bombardment species may be Xe, Ar, Ge, Si, or others, at an energy and dose depending on the bombarding species, but 5 KeV at a dose of $1E14/cm^2$ may be representative. However, other species and doses may be considered as well.

In this embodiment, the portions of liner material 130 that abut side surfaces 112 of fins 110 are exposed to ion implantation/bombardment. However, material attached to side surfaces 114 of fins 110 is not subjected to ion implantation/bombardment due to the shadowing effect of fins 110 during the angled ion implantation. Further, the portions of liner material 130 that are on top surface 142 of SOI substrate 140 are also exposed to ion implantation. The angled ion implantation 220 is carried out at an angle tilted from the vertical, exposing the portions of liner material 130 that abut side surfaces 112 of fins 110 to ion damage. The tilting angle may range from 15 degrees to 75 degrees, but it is more typically around 45 degrees from vertical. Depending on the thickness of the portions of liner material 130 that abut side surfaces 112 of fins 110 the threshold-modifying layer 12, the angled ion implantation 220 parameters can be so chosen to remove the portions of liner material 130 that abut side surfaces 112 of fins 110.

In FIG. 2, the ion implantation is angled such that portions of liner material 130 are shadowed, i.e., not exposed to the ion implantation, by fins 110 and portions of hard-mask 120. This results in the formation of protected liner portions 132 and 134 on side surface 114 of fins 110, and exposed liner portions 210, 212 and 214 on side surface 112 of fins 110 and top surface 142 of SOI substrate 140. As such, the protected liner portions (132 and 134) and the exposed liner portions (210, 212 and 214) have different characteristics/properties that allow for the selective removal of exposed liner portions 210, 212 and 214, as described in the discussion of FIG. 3A.

Figure 3A:
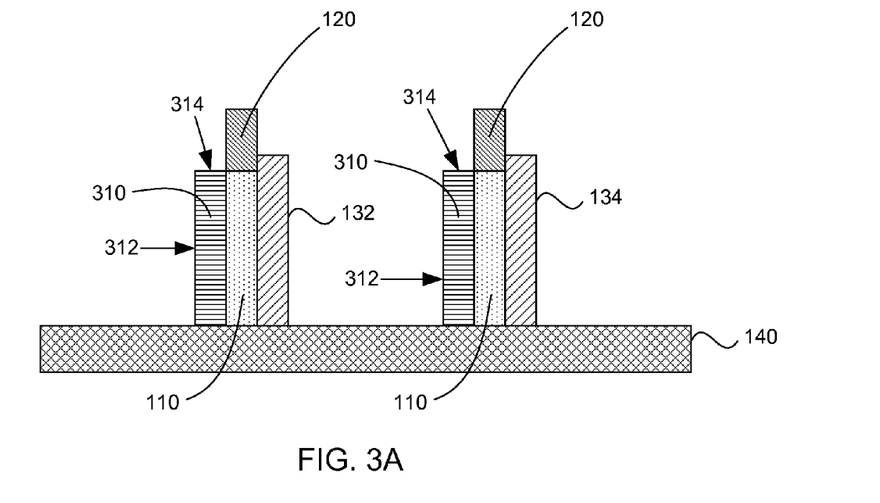
FIG. 3A illustrates a cross-sectional view depicting the removal of a portion of the liner material that was exposed to angled ion implantation and the formation of a biasing layer, in accordance with an embodiment of the present invention.

FIG. 3A illustrates a cross-sectional view depicting the removal of a portion of the liner that was exposed to angled ion implantation and the formation of a biasing material, in accordance with an embodiment of the present invention. Specifically, FIG. 3A illustrates the removal of exposed liner portions 210, 212 and 214. FIG. 3A also illustrates the epitaxial growth of biasing material 310 on side surface 112 of fins 110. In general, biasing material 310 is a threshold-voltage adjusting material that, in combination with other structures, causes a difference in the threshold voltage of side surface 112 when compared to side surface 114, of fin 110, during inversion and accumulation of the semiconductor devices of FIGS. 6 and 7 (when operating). In some embodiments, the resulting portions of biasing material 310 are faceted, provided that a significant portion (typically the majority) of the exposed sidewall (i.e., side surface 112) of fin 110 is covered by a portion of biasing material 310. Note that each portion of biasing material 310 includes a side surface 312 and a top surface 314, which may be referenced in following sections, though, for clarity of FIGS. 3B-7, the reference numerals are not shown, but side surface 312 and top surface 314 still exist.

As shown in FIG. 3A, portions of biasing material 312 are grown on the portion of fins 110 that is exposed (i.e., no longer covered) after the removal of exposed liner portions 210, 212 and 214. In this embodiment, biasing material 310 is composed of Silicon-Germanium (SiGe) (i.e., a molar ratio of silicon and germanium that forms an alloy with the ratio $Si_{1-x}Ge_x$). In one embodiment, the biasing material 310 is epitaxially grown on the exposed surface of fins 110. The epitaxial process is selective, meaning no biasing material 310 grows on the fin surfaces covered by the liner (e.g., liner portions 132 and 134). In this embodiment, exposed liner portions 210, 212 and 214 are removed using selective wet etching processes. However, those skilled in the art understand that many different techniques may be used to remove various materials and portions thereof.

Figure 3B:
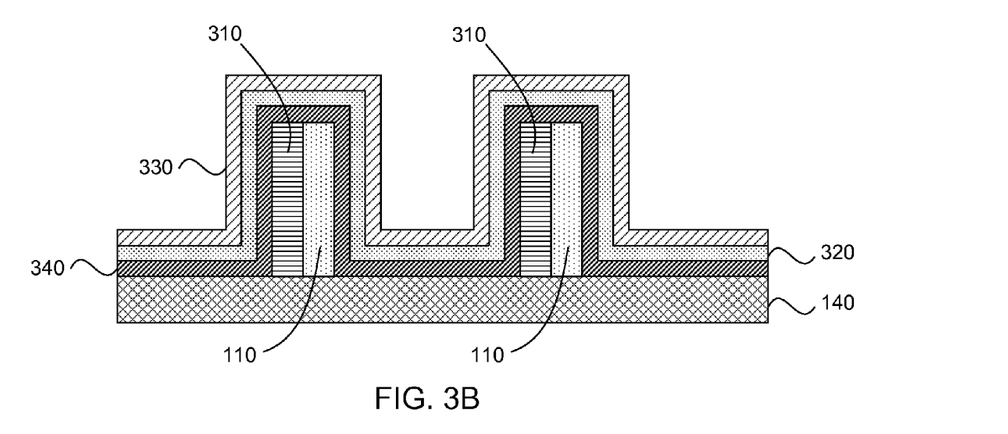
FIG. 3B illustrates a cross-sectional view depicting the removal of the portion of the liner material that was not exposed to angled ion implantation along with the portion of hard-mask, and the formation of a layer of high-k dielectric, a layer of metal and a layer of hard-mask, in accordance with an embodiment of the present invention.

FIG. 3B illustrates a cross-sectional view depicting the removal of the portion of the liner that was not exposed to angled ion implantation (i.e., protected liner portions 132 and 134) along with portions of hard-mask 120, and the formation of a layer of high-k dielectric 340, a layer of metal 320 and a layer of hard-mask 330, in accordance with an embodiment of the present invention. In some embodiments, an interfacial layer (not shown) may be formed on the exposed surfaces of fins 110 and biasing material 310 before deposition of the high-k dielectric 340. In the depicted embodiment, portions of hard-mask 120 and protected liner portions 132 and 134 are removed using selective etching processes. However, those skilled in the art understand that many different techniques may be used to remove various materials and portions thereof. Note that the layer of high-k dielectric 340 is, in the depicted embodiment, in contact with side surfaces 312 of biasing materials 310, side surfaces 114 of fins 110, and top surfaces 142 of SOI substrate 140.

In this embodiment, the layer of high-k dielectric 340 is composed of hafnium (IV) oxide ($HfO_2$). Other examples of high-k dielectrics include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. In this embodiment, the layer of metal 320 is composed of titanium nitride (TiN). In general, the layer of metal 320 is a gate conducting material. In this embodiment, the layer of hard-mask 330 is composed of silicon nitride (SiN). In other embodiments, the layer of hard-mask 330 is comprised of any material or combinations of materials that will act as a protecting layer during the formation of the semiconductor structure of FIG. 4.

Figure 4:
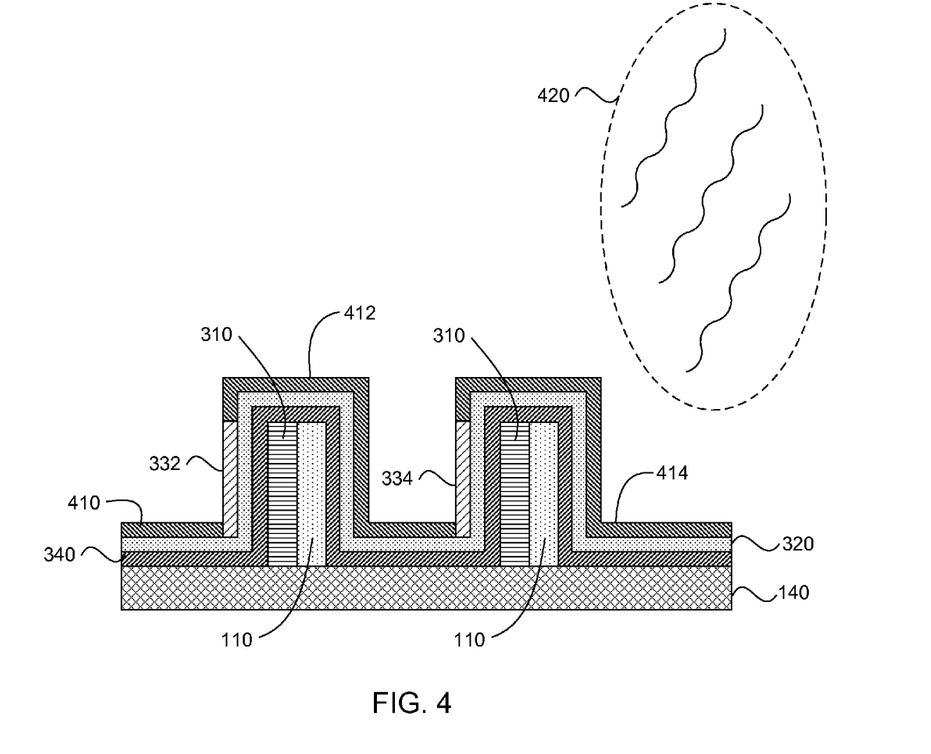
FIG. 4 illustrates a cross-sectional view depicting a semiconductor structure that results from exposing the semiconductor structure of FIG. 3B to angled ion implantation, in accordance with an exemplary embodiment of the present invention.

FIG. 4 illustrates a cross-sectional view depicting a semiconductor structure that results from exposing the semiconductor structure of FIG. 3B to angled ion implantation (420), in accordance with an exemplary embodiment of the present invention. Similar to the process described in the description of FIG. 2, the ion implantation is angled such that portions of the layer of hard-mask 330 are shadowed, i.e., not exposed to the ion implantation. In this case, during ion implantation, a portion of the layer of hard-mask 330 that is closest to and over side surface 312 of biasing material 310 (from the perspective of side surface 312, i.e., perpendicular from side surface 312) is shadowed. This results in the formation of protected hard-mask portions 332 and 334, and exposed hard-mask portions 410, 412 and 414. As such, the protected hard-mask portions (332 and 334) and the exposed hard-mask portions (410, 412 and 414) have different characteristics/properties that allow for the selective removal of exposed hard-mask portions 410, 412 and 414, as described in the discussion of FIG. 5A.

Figure 5A:
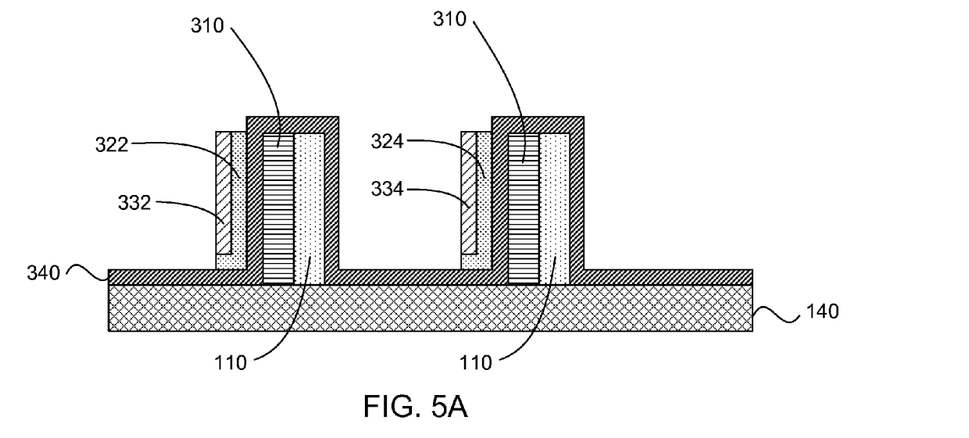
FIG. 5A illustrates a cross-sectional view depicting the removal of portions of the layer of metal and the layer of hard-mask of FIG. 4, in accordance with an embodiment of the present invention.

FIG. 5A illustrates a cross-sectional view depicting the removal of portions of the layer of metal 320 and the layer of hard-mask 330 of FIG. 4, in accordance with an embodiment of the present invention. Specifically, FIG. 5A illustrates the removal of exposed hard-mask portions 410, 412 and 414 of FIG. 4. FIG. 5A also illustrates the removal of the resulting exposed portions of the layer of metal 320, i.e., removal of portions of the layer of metal 320 that are not protected by hard-mask portions 332 and 334. This removal results in the formation of metal portions 322 and 324. In this embodiment, portions of the layer of metal 320 and the layer of hard-mask 330 are removed using selective etching processes. However, as is understood by those skilled in the art, many different techniques may be used to remove various materials and portions thereof. Note that, in this embodiment, the size and shape of metal portions 322 and 324 are due, in part, to the protection from etching provided by hard-mask portions 332 and 334.

Figure 5B:
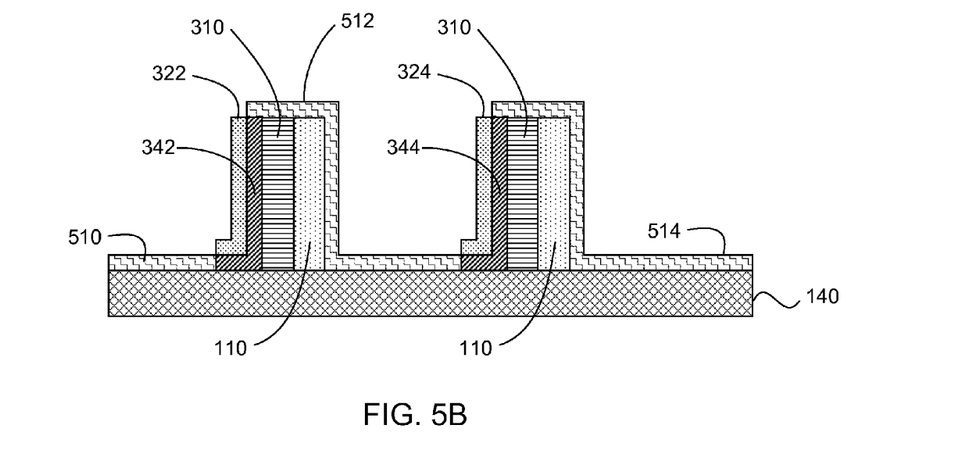
FIG. 5B illustrates a cross-sectional view depicting formation of portions of a work-function adjusting material on the semiconductor structure of FIG. 5A, in accordance with one embodiment of the present invention.

FIG. 5B illustrates a cross-sectional view depicting formation of portions of a threshold voltage adjusting material on the semiconductor structure of FIG. 5A, in accordance with one embodiment of the present invention. In this embodiment, protected hard-mask portions 332 and 334 are removed using selective etching. In addition, a work-function adjusting material (for example, lanthanum oxide ($La_2O_3$)) is deposited and diffused into the exposed portions of the layer of high-k dielectric 340, i.e., the portions of high-k dielectric 340 that are not protected by either one of metal portions 322 and 324. The diffusion of such a work-function adjusting material into the exposed portions of the layer of high-k dielectric 340 changes the threshold voltage of the exposed portions of the layer of high-k dielectric 340. When the FinFET is an NFET, lanthanum oxide reduces its threshold voltage. When the FinFET is a PFET, lanthanum oxide increases its threshold voltage. In another embodiment, the work-function adjusting material is aluminum or aluminum oxide. When aluminum or aluminum oxide is incorporated into a layer of high-k material, it raises NFET threshold voltage and reduces PFET threshold voltage. As such, the diffusion process results in the formation of work-function portions 510, 512 and 514, which yield a different threshold voltage for (at least one area of) the semiconductor device than a layer of high-k dielectric 340 yields by itself. In general, work-function portions 510, 512 and 514 are composed of a threshold-voltage adjusting material that, in combination with other structures (such as those of FIG. 3A), causes a difference in the threshold voltage of side surface 114 when compared to side surface 112, of fin 110, during inversion and accumulation of the semiconductor devices of FIGS. 6 and 7 (when operating).

The resulting work-function portions 510, 512 and 514 may be "n"-directional such as those produced through the diffusion of an element selected from the combination of groups IIA and IIIB of the periodic table of the elements, for instance lanthanum. Alternatively, an "n"-directional work-function portions 510, 512 and 514 may be an oxide of at least one element selected from the combination of groups IIA and IIIB of the periodic table of the elements, for instance lanthanum oxide. Alternatively, work-function portions 510, 512 and 514 may also be "p"-directional, such as a material that results from the diffusion of aluminum or aluminum oxide into the exposed portions of the layer of high-k dielectric 340.

The diffusion process also results in the formation of portions of high-k 342 and 344, which were not diffused as a result of the protection provided by metal portions 322 and 324. Note that work-function portions 512 and 514 abut side portion 114 of fins 110. Further, note that work-function portions 512 and 514 cover both i) the top surface 314 of the portion of biasing material 310 that abuts fin 110, and ii) the tops of portions of high-k 342 and 344.

Figure 6:
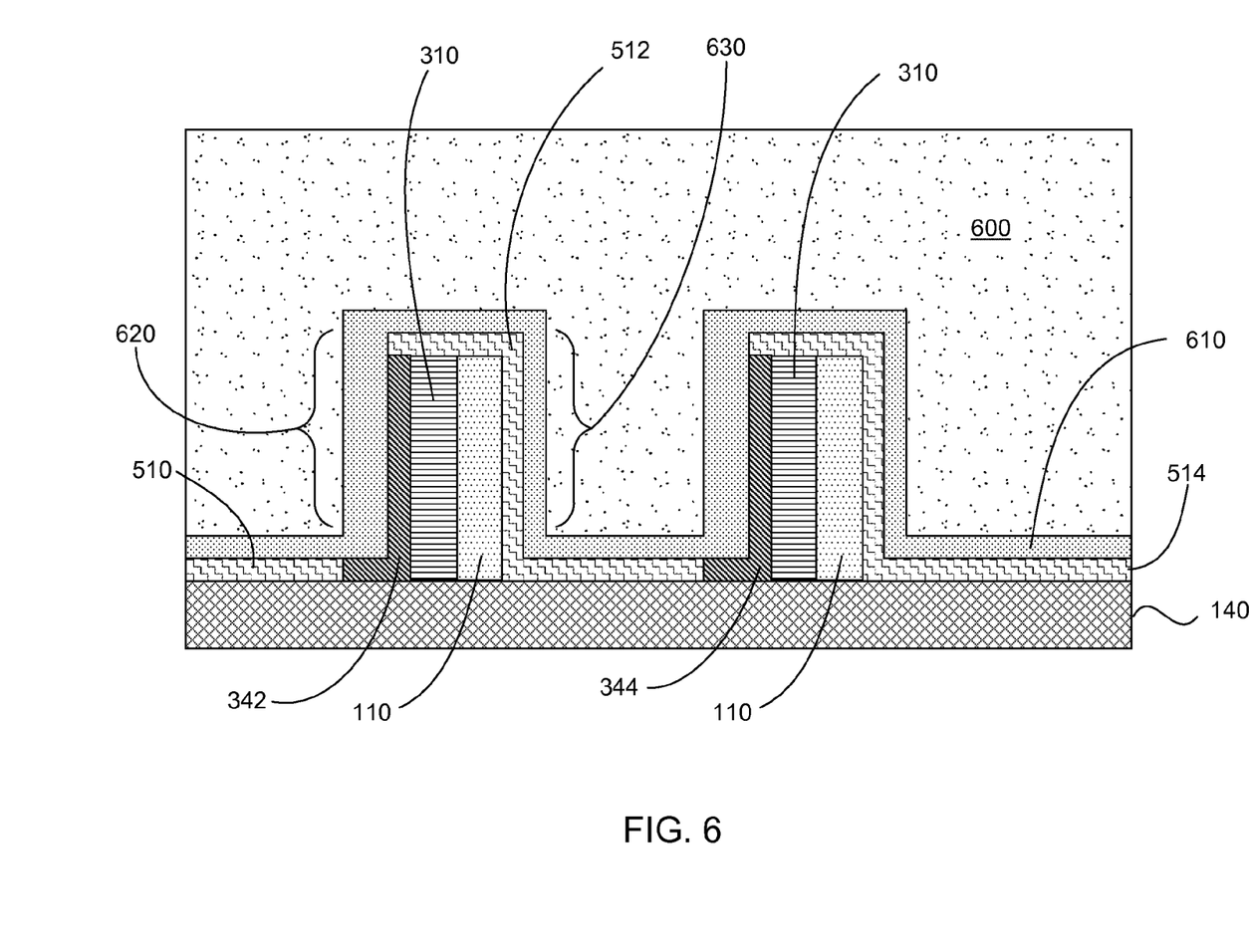
FIG. 6 illustrates a cross-sectional view depicting formation of a contiguous layer of metal and the formation of a layer of gate material on the semiconductor device of FIG. 5B, in accordance with one embodiment of the present invention.

FIG. 6 illustrates a cross-sectional view depicting formation of a contiguous layer of metal 610 (i.e., the formation of a contiguous layer of gate conducting material) and the formation of a layer of gate structure 600 on the semiconductor device of FIG. 5B, in accordance with one embodiment of the present invention. In this embodiment, contiguous layer of metal 610 is formed using the deposition of a layer of titanium nitride (TiN) onto the semiconductor structure of FIG. 5B. Note that, as illustrated in FIG. 6, because another layer of TiN is deposited over metal portions 322 and 324, the resulting contiguous layer of metal 610 is substantially thicker over side surface 312 of biasing materials 310 (indicated by bracket 620) when compared the contiguous layer of metal 610 over side surface 114 of fin 110 (indicated by bracket 630).

Alternatively, metal portions 322 and 324 can be stripped before the deposition of the continuous gate layer of TiN, resulting in a more uniform thickness of contiguous layer of metal 610. In this case, the continuous layer of metal 610 has substantially the same thickness overall. In general, metal 610 and gate structure 600 are formed by the deposition of one or more materials suitable for formation of a gate.

FIG. 6 illustrates the arrangement of metal 610 and gate structure 600 as an example only. Polysilicon is a preferred material in the art for completing a gate structure. However, this depiction should not limit the large number of materials and spatial arrangements that are known in the art as possibilities for disposing over the fin as a gate conductive layer/structure/device. There may be only one layer of material, or there may be multiple conductive layers over work-function portions 510, 512 and 514. Examples of materials known in the art that may be used for what FIG. 6 shows as metal 610 and gate structure 600 include (without limitation) one or more of: polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, or any suitable combination of these materials. The conductive material may further comprise dopants that are incorporated during or after deposition. Such processes and materials are well understood by those skilled in the art and, therefore, further discussion of them is omitted for brevity.

Figure 7:
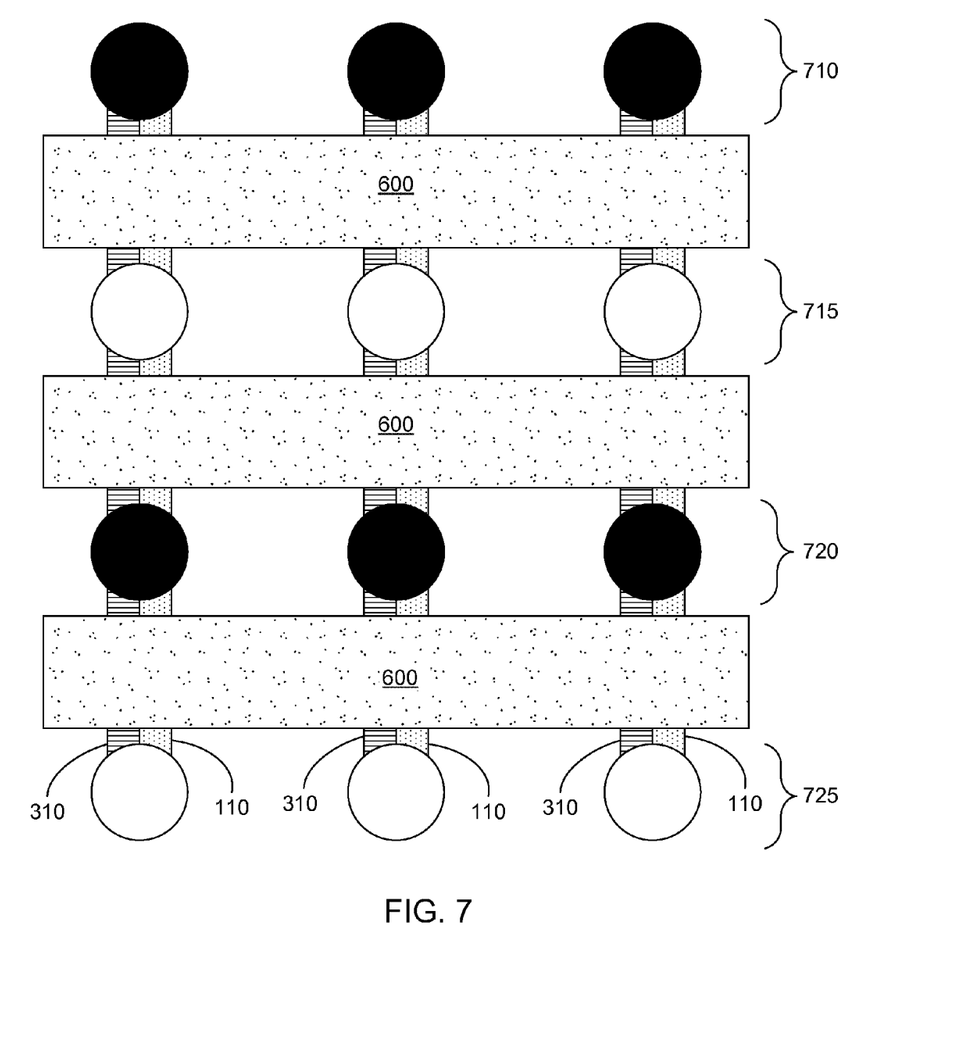
FIG. 7 illustrates a top view of a FinFET floating body memory with an asymmetric channel, in accordance with one embodiment of the present invention.

However, in some embodiments, the processes illustrated by FIG. 6 include one or more of: i) deposition of a work-function metal and gate electrode, ii) patterning of a gate stack, and iii) formation of source and drain structures (illustrated in FIG. 7).

FIG. 7 illustrates a top view of a FinFET floating body memory with an asymmetric channel, in accordance with one embodiment of the present invention. As shown in FIG. 7, there are three sets of fins 110 and corresponding portions of biasing material 310 that run perpendicular to, and beneath, three gate structures 600. In addition, FIG. 7 illustrates two sets of drain structures as dark circles (indicated by brackets 710 and 720), and two sets of source structures as light circles (indicated by brackets 715 and 725). In the case of FIG. 7, three gate structures 600 constitute word lines for a FinFET floating body memory that includes an asymmetric channel. The formation of the source/drain structures may include epitaxy, doping, annealing, silicidation, or any suitable combination of those techniques.

Electrical connections (not shown) may be made to source, drain, and gate structures. SOI substrate 140 may be grounded. Generally, if there is no voltage (above a threshold) on the gate between a given pair of source and drain structures, then there is no electrical conduction (connection) between those source and drain structures. As voltage (of the correct polarity) is applied to the gate, there is a "field effect" in the channel between the source and the drain, and current can flow between the source and the drain, which is controlled by the voltage applied to the gate. In this manner, a small signal (gate voltage) controls a relatively large signal (current flow between the source and the drain).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein.

In addition, any specified material or any specified dimension of any structure described herein is by way of example only. Furthermore, as will be understood by those skilled in the art, the structures described herein may be made or used in the same way regardless of their position and orientation. Accordingly, it is to be understood that terms and phrases such as, for instance, "side", "over", "perpendicular", "tilted", etc., as used herein refer to relative location and orientation of various portions of the structures with respect to one another, and are not intended to suggest that any particular absolute orientation with respect to external objects is necessary or required.

The foregoing specification also describes processing steps. While some of the steps may be in an ordered sequence, others may in different embodiments from the order that they were detailed in the foregoing specification. The ordering of steps when it occurs is explicitly expressed, for instance, by such adjectives as, "ordered", "before", "after", "following", and others with similar meaning.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature, or element, of any or all the claims.

Many modifications and variations of the present invention are possible in light of the above teachings, and could be apparent for those skilled in the art.

What is claimed is:

1. A semiconductor structure, the semiconductor structure comprising:
    a fin of a first semiconductor material, wherein said fin has a first side surface opposite a second side surface;
    a portion of a second semiconductor material, wherein the portion of the second semiconductor material has a third side surface opposite a fourth side surface, the fourth side surface of the second semiconductor material abutting and covering, at least in part, the first side surface of the fin;
    a portion of a third semiconductor material abutting and covering, at least in part, the second side surface of the fin;
    a single gate structure that covers, at least in part, the fin, the portion of the second semiconductor material and the portion of the third semiconductor material; and
    wherein the fin manifests a voltage asymmetry due, at least in part, to the portion of the second semiconductor material and the portion of the third semiconductor material.

2. The semiconductor structure of claim 1, wherein the portion of the second semiconductor material and the portion of the third semiconductor material are work-function adjusting materials that generate a voltage threshold asymmetry about the fin.

3. The semiconductor structure of claim 1, the semiconductor structure further comprising:
    a layer of high-k dielectric disposed over the third side surface of the second semiconductor material.

4. The semiconductor structure of claim 1, wherein the single gate structure includes at least one layer of gate electrode material.

5. The semiconductor structure of claim 1, wherein the single gate structure includes at least one layer of work function adjusting material.

6. The semiconductor structure of claim 1, wherein the single gate structure includes at least one layer of gate conductor material.

7. The semiconductor structure of claim 4, wherein the layer of gate electrode material is thicker over the third side surface of the portion of the second semiconductor material than over the second side surface of the fin.

* * * * *